United States Patent [19]

Fowler et al.

[11] Patent Number: 4,587,709
[45] Date of Patent: May 13, 1986

[54] METHOD OF MAKING SHORT CHANNEL IGFET

[75] Inventors: Alan B. Fowler, Yorktown Heights; Allan M. Hartstein, Chappaqua, both of N.Y.

[73] Assignee: International Business Machines Corporation, Armonk, N.Y.

[21] Appl. No.: 501,463

[22] Filed: Jun. 6, 1983

[51] Int. Cl.⁴ .................. H01L 21/76; H01L 21/302; H01L 21/225

[52] U.S. Cl. ........................... 29/571; 29/579; 148/1.5; 148/175; 148/187; 148/DIG. 82; 357/23.3; 357/41; 357/91

[58] Field of Search .............. 148/1.5, 187, 175; 29/576 B, 571, 579; 357/23, 41, 91

[56] References Cited

U.S. PATENT DOCUMENTS

| | | | |
|---|---|---|---|
| 3,837,935 | 9/1974 | Maeda et al. | 148/187 |
| 4,037,307 | 7/1977 | Smith | 29/571 |
| 4,037,308 | 7/1977 | Smith | 29/571 |
| 4,074,300 | 2/1978 | Sakai et al. | 357/23 |
| 4,189,737 | 2/1980 | Schrader et al. | 357/23 |
| 4,287,660 | 9/1981 | Nicholas | 29/571 |
| 4,312,680 | 1/1982 | Hsu | 148/1.5 |
| 4,313,782 | 2/1982 | Sokoloski | 29/571 |
| 4,358,340 | 11/1982 | Fu | 156/643 |
| 4,377,899 | 3/1983 | Otani et al. | 29/571 |
| 4,450,620 | 5/1984 | Fuls et al. | 29/571 |
| 4,460,413 | 7/1984 | Hirata et al. | 148/1.5 |
| 4,471,524 | 9/1984 | Kinsbron et al. | 29/571 |

FOREIGN PATENT DOCUMENTS 0066675 12/1982 European Pat. Off.
1586423 3/1981 United Kingdom.

OTHER PUBLICATIONS

IBM Technical Disclosure Bulletin, vol. 13, No. 11, Apr. 1971, "MOSFET Structures Using Selective Epitaxial Growth", L. M. Terman, pp. 3279-3280.

The American Physical Society, Sep. 3, 1979, vol. 43, No. 10, "Experimental Study of Anderson Localization in Thin Wires", N. Giordano et al., pp. 725-728.

IEEE Electron Device Letters, vol. EDL-2, No. 1, Jan. 1981, "A New Edge-Defined Approach for Submicrometer MOSFET Fabrication", Hunter et al., pp. 4-6.

*Primary Examiner*—Upendra Roy
*Attorney, Agent, or Firm*—Pollock, Vande Sande & Priddy

[57] ABSTRACT

A process for defining small dimensions by forming a vertical step in an etchable material; edge depositing a masking material by angularly evaporating a metal; and etching away all of the first material not covered by the masking material; and device obtained by depositing source, drain, and gate defining material.

17 Claims, 16 Drawing Figures

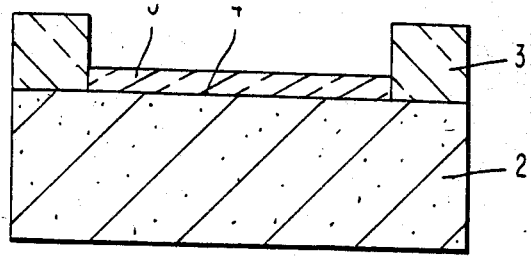
FIG. 1.1
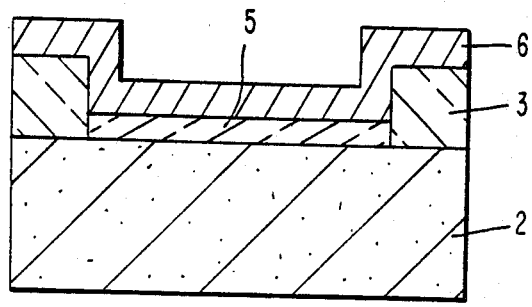
FIG. 1.2
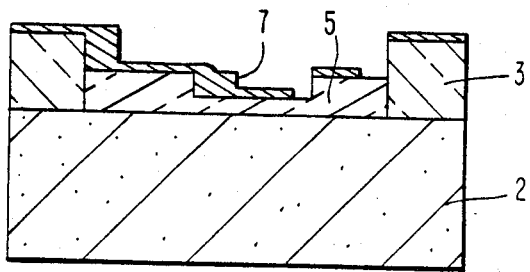
FIG. 1.3
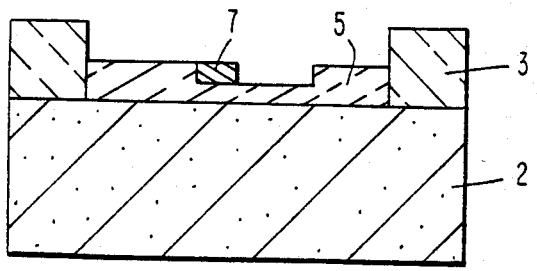
FIG. 1.4

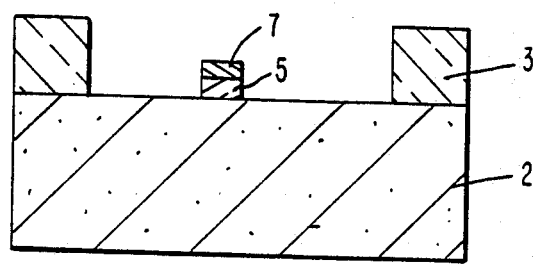
FIG. 1.5
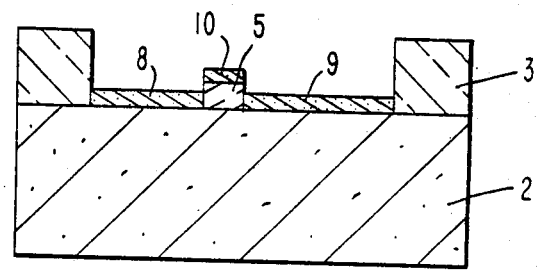
FIG. 1.6
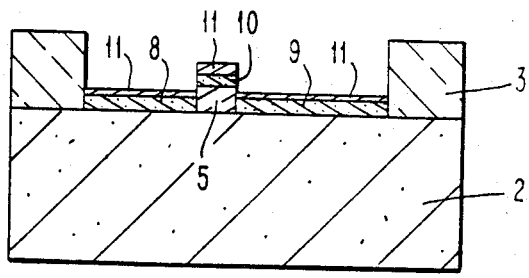
FIG. 1.7

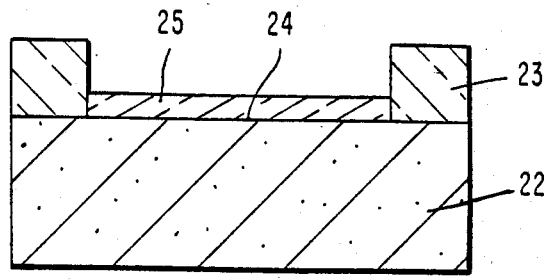
FIG. 2.1
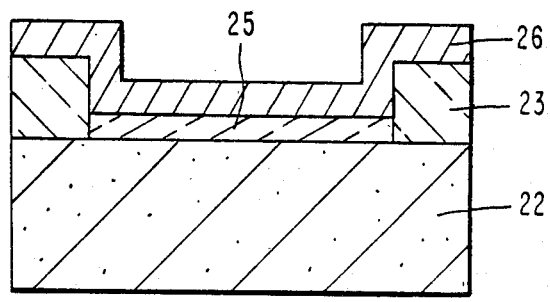
FIG. 2.2
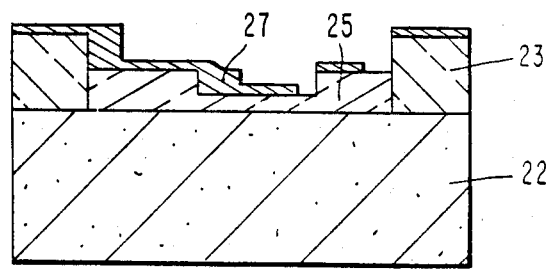
FIG. 2.3
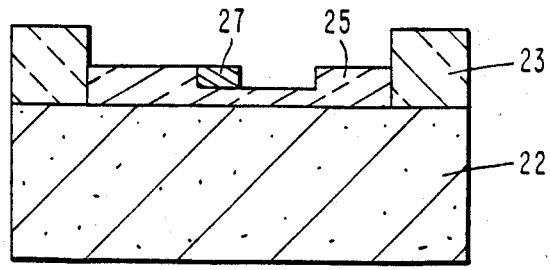
FIG. 2.4

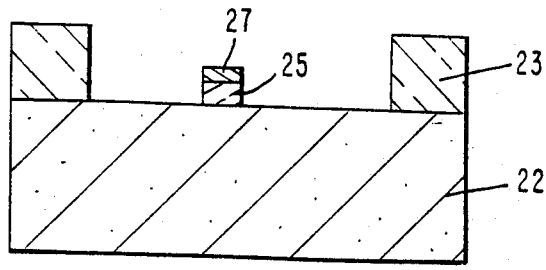
FIG. 2.5
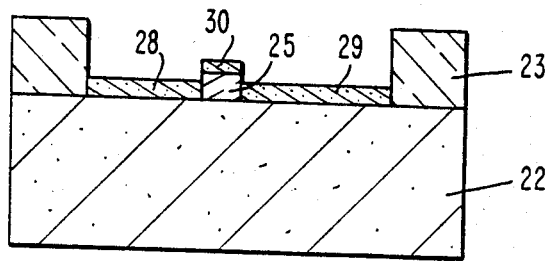
FIG. 2.6
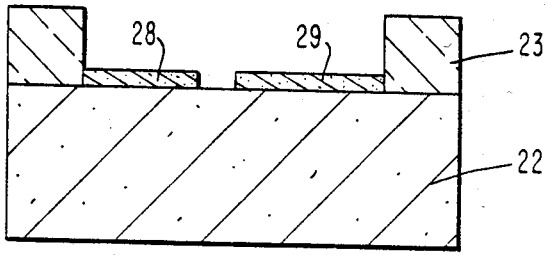
FIG. 2.7
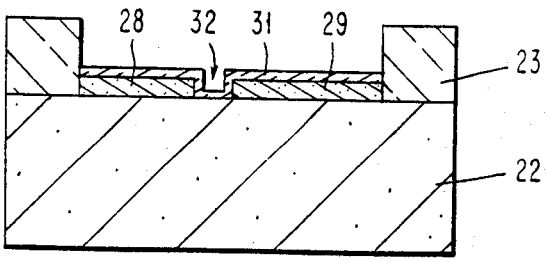
FIG. 2.8
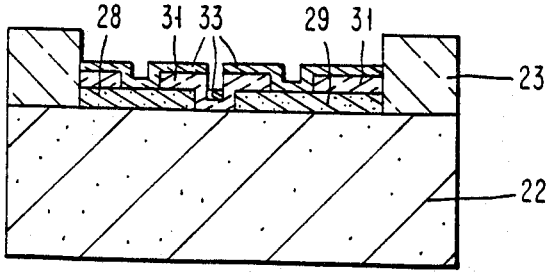
FIG. 2.9

METHOD OF MAKING SHORT CHANNEL IGFET

DESCRIPTION

1. Technical Field

The present invention is concerned with defining small dimensions and in particular, is concerned with field effect transistors having narrow gate regions. Moreover, the present invention is especially concerned with field effect transistors wherein the gate regions, in addition to being narrow, are self-aligned with respect to the source and drain regions.

2. Background Art

The speed or frequency response of field effect transistor type devices is limited by the transit time of the carriers (electrons or holes, depending on the substrate doping) and the capacitance of the gate. There have been efforts in the art to fabricate short channel field effect transistors in order to reduce the transit time and capacitance of the gate. However, those processes suggested in the prior art are somewhat complicated and not especially reproducible. Exemplary of certain techniques attempted or suggested for providing short channel FETs involve the relative etching rates of metals and silicon dioxide, overlapping gate structures, serial diffusions, and converging crystallographic plane preferential etching.

SUMMARY OF INVENTION

The fabrication technique employed according to the present invention is a much simpler method than the various techniques previously suggested for providing small dimensions. Moreover, the fabrication technique of the present invention is extremely reproducible and easy to control.

The fabrication technique employed according to the present invention makes it possible to provide gates which are self-aligned to the source and drain regions and do not overlap the source and drain.

An advantage of the fabrication technique of the present invention is that the alignment of the step in the well need not be very precise. The well is relatively large and the step merely has to be located somewhere in the middle thereof so that it aligns with a gate pad.

The present invention is concerned with defining small dimensions of about 5000 Å or less. In particular, the process provides a vertical step in a first material having a first response to an etching operation wherein said material is located on a substrate. A second and different material is edge deposited on the step. This is accomplished by evaporating a metal at an angle sufficient to provide a thicker metal deposit adjacent to said step than over said surface. The metal has a second and different response from the first material to the etching operation. Moreover, the metal has the property of acting as a mask in the etching operation.

All of the first material not covered by the mask is removed by the etching, at least down to the substrate.

Moreover, the present invention is concerned with a process for fabricating a self-aligned gate field effect transistor. The process comprises providing a vertical step in an isolation material on a semiconductor substrate. A metal is edge deposited against the vertical step by evaporating the metal at an angle sufficient to provide a thicker metal deposit adjacent to said step than over said surface. The isolation material is etched away to the substrate, except where masked by the metal to thereby produce an isolation material mesa. Source, drain, and gate defining material are deposited on the horizontal surfaces at both sides of the mesa and at the top of the mesa.

The device aspect of the present invention is concerned with a field effect transistor comprising source and drain regions and narrow gate region between the source and drain region wherein the length of the narrow gate region is 500 angstroms or less and wherein the source and drain are self-aligned with respect to the narrow gate region and are doped silicon surfaces deposited onto the semiconductor substrate.

BRIEF DESCRIPTION OF DRAWINGS

FIGS. 1.1–1.7 are schematic views of a field effect transistor in various stages of fabrication according to the process of the present invention.

FIGS. 2.1–2.9 are schematic views of another field effect transistor in various stages of fabrication according to the process of the present invention.

BEST AND VARIOUS MODES FOR CARRYING OUT INVENTION

For convenience, the discussion of the fabrication steps is directed to the preferred aspect of employing a p-type silicon substrate as the semiconductor substrate and n-type carriers (electrons) with n-type source and drain regions. Accordingly, it is understood that an n-type substrate and p-type diffused or implanted dopant impurities in the source and drain regions can be employed according to the present invention in p-channel FET technology.

It is understood that when the discussion refers to n-type impurities, the process steps are applicable to p-type impurities and vice versa. Also, the present invention is applicable to substrates other than silicon. Also, as used herein, the terms "metallic type interconnection lines" or "high conductivity interconnection lines" refer to metal lines, such as aluminum as well as non-metallic materials (e.g., highly doped polysilicon or intermetallic silicides) which nevertheless, can have conductivities of the magnitude generally possessed by conductive metals. Also, when reference is made to impurities of a "first type" and to impurities of a "second type", it is understood that the second type refers to opposite conductivity type to the "first type". That is, if the "first type" is p, then the "second type" is n. If the "first type" is n, then the "second type" is p.

Although the fabrication process is described employing the preferred material, aluminum, as the gate and metallic interconnections, other materials can be employed for such purpose. In particular, the gate and metallic interconnections can be fabricated from refractory metals in addition to aluminum or silicides thereof. A refractory is understood within the context of the present invention, to be a metal which can withstand the high temperatures experienced during the fabrication without degrading to an undesired degree. Examples of some suitable refractory metals include tungsten, tantalum, hafnium, and rhodium. Examples of some suitable silicides include tungsten silicide, tantalum silicide, hafnium silicide, and rhodium silicide.

Referring to FIG. 1.1, there is shown a p-type silicon substrate 2 having any desired crystal orientation (e.g., <100>). The p-type silicon substrate 2 is prepared by slicing and polishing a p-type boule grown in the presence of a p-type dopant such as boron following conventional crystal growth techniques. Other p-type dopants for silicon include aluminum, gallium, and indium.

Field oxide isolation 3 can be fabricated by any of several known procedures including thermal oxidation of the semiconductor substrate or by well-known vacuum or chemical vapor deposition techniques. Furthermore, the field oxide may be formed above the semiconductor surface or it may be partially or fully recessed into the semiconductor substrate. An example of one such procedure is the fully recessed oxide isolation technique disclosd in U.S. Pat. No. 3,899,363, disclosure of which is incorporated herein by reference.

For the purpose of illustration of the procedure of the present invention, a non-recessed field isolation oxide 3 will be used. The field isolation regions are generally about 4,000 to about 10,000 angstroms thick. The field oxide regions 3 are delineated by employing a lithographic mask. The mask is of a transparent material having opaque portions in a predetermined pattern. The field oxide 3 using a photolithographic technique is etched from that area 4 wherein a thin oxide layer 5 is to be subsequently provided. The layer of silicon dioxide 5 is grown on or deposited onto the silicon substrate 2 in the area 4. This silicon dioxide, which is usually about 100 to about 1,000 angstroms thick, can be formed by thermal oxidation of the silicon surface at 1,000° C. in the presence of dry oxygen.

Next, a masking material 6 is deposited over the structure (see FIG. 1.2). A particular material employed is aluminum, which can be deposited by known evaporation techniques. A preselected hole is then etched into the masking layer 6 by a known masking technique, thereby forming a mask for subsequent etching of the oxide layer 5 which has been exposed by the removal of the masking material 6. For instance, the aluminum can be etched employing a known etchant such as a composition containing about 1 part by volume of nitric acid, about 4 parts by volume of water, and about 20 parts by volume of phosphoric acid. Such an etch can be accomplished at room temperature with about 2.6 angstroms being removed per second.

Next, a depression or step is formed in the oxide layer 5, as illustrated in FIG. 1.3, by etching the oxide, preferably by reactive ion etching, to remove oxide not protected by the aluminum layer. The etch employed should be a directional etching procedure to produce a well-defined step in the oxide. Preferably the amounts etched away should be one-half of the total thickness of the oxide layer. Typical conditions of reactive ion etching include using a $CF_4$ gas at about 25 microns of pressure at a gas flow rate of about 40 standard cubic centimeters per minute and employing about 20 watts of power which is equivalent to a power density of about 0.073 watts per $cm^2$. These particular parameters provide for an etch rate of about 160 angstroms per minute.

An alternative procedure is to fully etch the silicon dioxide 5 down to the underlying silicon substrate 2 and subsequently, to regrow a thin oxide layer. For instance, a 1,000 angstrom oxide layer might be completely etched by this procedure and a 500 angstrom oxide layer regrown. This procedure would also produce the desired oxide step.

The remaining masking layer 6 is then stripped away. For instance, in the case of aluminum, the above described etching composition can be employed.

Next, a metal 7 is deposited, preferably by evaporation, angularly, such that a thicker metal deposit is provided adjacent the step as compared to that over the horizontal surface of the oxide. Likewise, metal 7 is deposited as illustrated in FIG. 1.3 over the entire structure with thicker metal deposit adjacent the field oxide 3 than over the horizontal surfaces of the oxide. The angle of evaporation should be greater than 45° from the surface normal and preferably, is at least about 60°. The larger the angle, the better the process. The angle is less than 90° and preferably, as close to 90° as possible to deposit the metal. The most preferred angle range is about 60° to about 80°. The difference between the thickness of the surface and that adjacent to the step is a sine-cosine relationship. For instance, at an evaporation angle of about 80°, the ratio of the metal adjacent to the step to that on the surface is about 5.7:1. Any metal which can be deposited directionally, such as by vaporization, can be employed. Preferred metals include aluminum and gold.

In a typical application, the metal is deposited to provide a thickness of about 100 to about 5,000 angstroms adjacent the step. It is preferred that the thickness of the metal adjacent the step be equal to about the height of the step. The thickness adjacent the step is at least two times and preferably, at least three times that on the surface. In a particular embodiment, about 700 angstroms thickness of aluminum is deposited on the step at an 80° angle. In such instance, about 120 angstrom thickness of aluminum is deposited on the surface.

In order to provide the small dimension, the surface aluminum coverage is then etched off, leaving a residual aluminum coverage on the oxide step (see FIG. 1.4). Since the aluminum is thicker adjacent the step, etching of the aluminum on the horizontal surfaces results in leaving an amount of aluminum which is sufficient to provide the small dimensions desired. In addition, the aluminum adjacent the field oxide 3 can be removed by etching, while protecting by photolithographic technique, the aluminum adjacent the step. However, if desired, the aluminum present adjacent the field oxide 3 need not be removed since it is remote from the gate region.

The etching of the aluminum at this stage can be a quick dip etch which can employ the etching composition discussed hereinabove for the initial etch requirements. It is preferable that the etching be somewhat controlled and slow so as not to remove more than necessary from the step portion of the structure. If desired, the aluminum can be etched using reactive ion etching, sputtering, or ion milling techniques.

Typically, the aluminum portion remaining will be up to a maximum of about 5,000 angstroms in length and preferably, at least about 100 angstroms in length. Generally, the length dimensions of the aluminum remaining is about 150 to about 3,000 angstroms and more usually, about 150 to about 500 angstroms. Lengths of about 100 to 150 angstroms are readily produced by the process.

The device, at this stage of the fabrication, is shown in FIG. 1.4.

It is critical to the present invention that a layer 7 being an angularly deposited metal and not another material such as polycrystalline silicon as reported in U.S. Pat. No. 4,358,340 to Fu. For instance, the process of the present invention is easier to control than that reported in U.S. Pat. No. 4,358,340. In particular, the etching of the polycrystalline silicon is an anisotropic vertical etch which must be carefully controlled as the relative thickness of material in the region which is to remain, to that to be completely removed, is not nearly as large as achievable by practicing the present invention. The smaller the desired widths, the greater the degree of the caution which must be exercised to control the process of U.S. Pat. No. 4,358,340.

The remaining aluminum layer 7 is now employed as a mask for removing by etching the oxide material 5 which is not beneath and protected by aluminum portion 7. The preferred etching technique employed in this stage of the process is a reactive ion etching. The etch employed should be a directional etching procedure wherein the typical conditions include using a $CF_4$ gas at about 25 microns of pressure at a gas flow rate of about 40 standard cubic centimeters per minute and employing about 20 watts of power which is equivalent to a power density of about 0.073 watts per $cm_2$. These particular parameters provide for an etch rate of about 160 angstroms per minute.

During this reactive ion etching, it is desirable to coat the isolation regions 3 with a metal such as aluminum in order to prevent etching thereof. However, it is not necessary to provide a metal coating over the field oxide since such is significantly thicker than the oxide regions 5 in the device areas that a substantial portion of the oxide 3 will remain after the directional reactive ion etching is completed even if such is not protected by a metal such as aluminum. The silicon dioxide 5 is etched all the way down to the silicon substrate layer as illustrated in FIG. 1.5.

The aluminum layer 7 is then removed such as by a chemical etch to leave a silicon dioxide mesa 5 as illustrated in FIG. 1.6. The aluminum can be removed by employing an etchant such as a composition containing about 1 part by volume of nitric acid, about 4 parts per volume of water, and about 20 parts by volume of phosphoric acid. Such an etch can be accomplished at room temperature with about 2.6 angstroms being removed per second.

A thin layer such as at least about 150 angstroms and usually not in excess of about one-half the thickness of oxide 5 of heavily doped n+ silicon is deposited at the sides of the mesa silicon dioxide 5 and atop the mesa silicon dioxide 5. The doped silicon layers 8 and 9 do not entirely coat the sidewalls of the silicon dioxide mesa and do not electrically short out the doped silicon deposit 10 on top of the oxide mesa 5 to thereby provide the structure shown in FIG. 1.6.

The doped silicon layers 8, 9, and 10 can be formed by conventional evaporation which provides amorphous silicon or polysilicon which is then recrystallized to provide polycrystalline silicon by heating to temperatures of about 700° C. In addition, the doped silicon surfaces 8, 9, and 10 can be formed by a Si molecular beam epitaxy technique carried out in vacuum at temperatures above 700° C. Molecular beam epitaxy is an evaporative directional coating technique whereby single crystal silicon layers grow epitaxially only on bare silicon surfaces. On the silicon dioxide surfaces, polycrystalline silicon is formed. Such a process would result in source and drain regions 8 and 9 respectively being single crystal silicon, whereas the gate portion 10 would be polycrystalline silicon. In the alternative, the silicon regions 8 and 9 can be provided by chemical vapor deposition which would provide silicon only on the silicon surfaces provided the $SiO_2$ regions were clean.

In this technique, the gate portion 10 can be provided along with providing the metallic-type interconnections in the following step of the process.

The above described methods for providing the source and drain regions help make it possible to obtain very short devices since conventional methods of doping (e.g.—ion implantation and thermal diffusion) result in a greater degree of diffusion of dopant beneath the gate region. Therefore, if the gate region is too short, a shorting path between source and drain could occur when using the conventional techniques.

Metallic type interconnections can then be provided to the source, drain, and gate regions by known techniques such as by evaporation. The metallic-type high electrical conductivity interconnections can be metal such as aluminum or can be preferably a metal silicide formed by sintering after deposition of the metal.

Next, a photoresist layer (not shown) is applied to the assembly. The resist material is exposed with ultraviolet radiation using a predetermined mask pattern and the exposed regions of the resist are dissolved away. Then the structure is treated to remove the portions of the conductive material not protected by the resist. The structure achieved is illustrated in FIG. 1.7.

Reference to FIGS. 2.1 to 2.8 illustrates another fabrication sequence employing the techniques of the present invention. In FIG. 2.1 there is shown a p-type silicon substrate 22 having any desired crystal orientation (e.g., <100>).

Field oxide isolation 23 can be fabricated by any of several known procedures including thermal oxidation of the semiconductor substrate or by well-known vacuum or chemical vapor deposition techniques. Furthermore, the field oxide may be formed above the semiconductor surface or it may be partially or fully recessed into the semiconductor substrate. For the purpose of illustration of the procedure of the present invention, a non-recessed field isolation oxide 23 will be used. The field isolation regions are generally about 4,000 to about 10,000 angstroms thick. The field oxide regions 23 are delineated by employing a photolithographic mask. The mask is of a transparent material having opaque portions in a predetermined pattern. The field oxide 23, using a photolithographic technique is etched from that area 24 wherein a thin oxide layer 25 is to be subsequently provided. The layer of silicon dioxide 25 is grown on or deposited onto the silicon substrate 22 in the area 24. This silicon dioxide, which is usually about 100 to about 1,000 angstroms thick, can be formed by thermal oxidation of the silicon surface at 1,000° C. in the presence of dry oxygen.

Next, a masking material 26 is deposited over the structure (see FIG. 2.2). A particular material employed is aluminum which can be deposited by known evaporation techniques. A preselected hole is then etched into the masking layer 26 by a known masking technique, thereby forming a mask for subsequent etching of the oxide layer 25 which has been exposed by the removal of the masking material 26. For instance, the aluminum can be etched employing a known etchant such as a composition of the type discussed hereinabove.

Next, a depression or step is formed in the oxide layer 25, as illustrated in FIG. 2.3, by etching the oxide, preferably by reactive ion etching, to remove oxide not protected by the aluminum layer. The etch employed should be a directional etching procedure to produce a well-defined step in the oxide. Preferably the amounts etched away should be one-half of the total thickness of the oxide layer. Typical conditions of reactive ion etching include using $CF_4$ gas at about 25 microns of pressure at a gas flow rate of about 40 standard cubic centimeters per minute and employing about 20 watts of power which is equivalent to a power density of about 0.073 watts per cm$^2$.

An alternative procedure is to fully etch the silicon dioxide 25 down to the underlying silicon substrate 22 and subsequently, to regrow a thin oxide layer. For instance, a 1,000 angstrom oxide layer might be completely etched by this procedure and a 500 angstrom oxide layer regrown. This procedure would also produce the desired oxide step.

The remaining masking layer 26 is then stripped away. For instance, in the case of aluminum, the above described etching composition can be employed.

Next, a metal 27 is deposited, preferably by evaporation, angularly, such that a thicker metal deposit is provided the adjacent step as compared to that over the horizontal surface of the oxide.

Likewise, metal 27 is deposited as illustrated in FIG. 2.3 over the entire structure with thicker metal deposit adjacent the field oxide 23 than over the horizontal surfaces of the oxide.

The angle of evaporation should be greater than 45° from the surface normal and preferably, is at least about 60°. The larger the angle, the better the process. The angle is less than 90° and preferably, as close to 90° as possible to deposit the metal. The most preferred angle range is about 60° to about 80°. The difference between the thickness of the surface and that adjacent to the step is a sine-cosine relationship. For instance, at an evaporation angle of about 80°, the ratio of the metal adjacent to the step to that on the surface is about 5.7:1. Any metal which can be deposited directionally, such as by vaporization can be employed. Preferred metals inlcude aluminum and gold.

In a typical application, the metal is deposited to provide a thickness of about 100 to about 5,000 angstroms adjacent the step. It is preferred that the thickness of the metal adjacent the step be equal to about the height of the step. The thickness adjacent the step is generally at least two times, and preferably at least three times, that on the surface. In a particular embodiment, about 700 angstroms thickness of aluminum is deposited on the step at an 80° angle. In such instance, about 120 angstrom thickness of aluminum is deposited on the surface.

In order to provide the small dimension, the surface aluminum coverage is then etched off, leaving a residual aluminum coverage on the oxide step (see FIG. 2.4). Since the aluminum is thicker adjacent the step than on the horizontal surfaces, etching of the aluminum on the horizontal surfaces results in leaving an amount of aluminum which is sufficient to provide the small dimensions desired. In addition, the aluminum adjacent the field oxide 23 can be removed by etching, while protecting by photolithographic technique, the aluminum adjacent the step. However, if desired, the aluminum present adjacent the field oxide 23 need not be removed since it is remote from the gate region.

The etching of the aluminum at this stage can be a quick dip etch which can employ the etching composition discussed hereinabove for the initial etch requirements. It is preferable that the etching be somewhat controlled and slow so as not to remove more than necessary from the step portion of the structure.

If desired, the aluminum can be etched using reactive ion etching, sputtering, or ion milling technique.

Typically, the aluminum portion remaining will be up to a maximum of about 5,000 angstroms in length, and preferably, at least about 100 angstroms in length. Generally, the length dimensions of the aluminum remaining is about 150 to about 3,000 angstroms and more normally, about 150 to about 500 angstroms. Lengths of about 100 to 150 angstroms are readily produced by the process.

The device at this stage of the fabrication is shown in FIG. 2.4.

The remaining aluminum layer 27 is now employed as a mask for removing by etching the oxide material 5 which is not beneath and protected by aluminum portion 27. The preferred etching technique employed in this stage of the process is a reactive ion etching. The etch employed should be a directional etching procedure wherein the typical conditions include using a CF$_4$ gas at about 25 microns of pressure at a gas flow rate of about 40 standard cubic centimeters per minute and employing about 20 watts of power which is equivalent to a power density of about 0.073 watts per cm$_2$.

During this reactive ion etching, it is desirable to coat the isolation regions 23 with a metal such as aluminum in order to prevent etching thereof. However, it is not necessary to provide a metal coating over the field oxide since such is significantly thicker than the oxide regions 25 in the device areas that a substantial portion of the oxide 23 will remain after the directional reactive ion etching is completed even if such is not protected by a metal such as aluminum. The silicon dioxide is etched all the way down to the silicon substrate layer as illustrated in FIG. 2.5.

The aluminum layer 27 is then removed such as by a chemical etch to leave a silicon dioxide mesa 25 as illustrated in FIG. 2.6. The aluminum can be removed by employing an etchant of the type discussed hereinabove.

A thin layer such as at least about 150 angstroms and usually not in excess of about one-half of the thickness of dioxide 25 of heavily doped n+ silicon is deposited at the sides of the mesa silicon dioxide 25. The doped silicon layers 28 and 29 do not entirely coat the sidewalls of the silicon dioxide mesa to thereby provide the structure shown in FIG. 2.6.

The silicon layers 28, 29, and 30 can be formed by conventional evaporation which provides amorphous or polysilicon which is then recrystallized to provide polycrystalline silicon by heating to temperatures of about 700° C. In addition, the silicon surfaces 8, 9, and 10 can be formed by a Si molecular beam epitaxy technique carried out under vacuum at temperatures in excess of 700° C. Such a process would result in source and drain regions 28 and 29, respectively, being single crystal silicon, whereas the portion 30 would be polycrystalline silicon. In the alternative, the silicon regions 28 and 29 can be provided by chemical vapor deposition which would provide silicon only on the silicon surfaces, provided the SiO$_2$ regions were clean.

The SiO$_2$ mesa 25 is now removed such as by chemical etching which also results in lifting off of the layer 30 of n+ polycrystalline silicon, if present, on top of the mesa (see FIG. 2.7). For instance, the SiO$_2$ mesa can be etched using a solution of buffered hydrofluoric acid.

Since the oxide regions 23 are much thicker than SiO$_2$ region 25, etching of the region 25 will not result in removal of any significant amount of the regions 23. Moreover, if desired, the oxide regions 23 can be protected by conventional photolithographic techniques during the etching of region 25.

The silicon surfaces 22, 28, and 29 can be oxidized to provide the desired gate oxide 31 (see FIG. 2.8). An advantage of the present invention is that the gate oxide layer 31 can be made relatively thin such as about 50 to about 100 angstroms and the source and drain contacts can be of relatively low resistivity. This allows the device to be switched at low enough gate voltages to function in logic circuitry.

High electrical conductivity lines are connected to the source 28, drain 29, and gate region 32.

Electrical connections are fabricated by applying a photoresist layer to the assembly. The resist materials are exposed with ultraviolet radiation using a lithographic masking pattern, and the exposed regions of the resist are dissolved away. Next, the structure is treated to remove the portions of the oxide not protected by the resist material. For instance, the structure is immersed in a solution of buffered hydrofluoric acid to provide contact holes or vias through the oxide insulation layer 31 to allow electrical connection to be made to the source and drain of the FET. The remaining photoresists above the etched silicon dioxide are then removed by dissolving in a suitable solvent.

Next, the metallic-type high electrical conductivity interconnection line material 33, preferably a metal, is deposited and the interconnection pattern is delineated. An example of a highly conductive material commonly used for interconnections is aluminum. The high electrical conductivity material, such as aluminum, may be deposited by sputtering or preferably, by evaporation.

Next, a photoresist layer (not shown) is applied to the assembly. The resist material is exposed with ultra-violet radiation using a predetermined mask pattern and the exposed regions of the resist are dissolved away. Then the structure is treated to remove the portions of conductive material not protected by the resist. The structure at this stage is illustrated in FIG. 2.9. If some minor deposition of metal should occur on the sidewalls, making electrical contact to the gate region 32 from the source and drain regions, such can be readily removed by a quick dip etch.

Having thus described our invention, what we claim as new and desire to secure by Letters Patent is:

1. A process for fabricating a self-aligned gate field effect transistor which comprises:
   a. providing a vertical step in an isolation material on a semiconductor substrate;
   b. edge depositing metal against said vertical step by evaporating the metal at an angle sufficient to provide a thicker metal deposit adjacent to said step than over said surface.
   c. etching away said isolation material to the substrate, except where masked by said metal, thereby producing an isolation material mesa; and
   d. depositing source, drain, and gate defining material on the horizontal surfaces at both sides of said mesa and at the top of said mesa.
2. The process of claim 1 wherein said isolation material is an oxide.
3. The process of claim 1 wherein said metal is aluminum or gold.
4. The process of claim 1 wherein said metal is aluminum.
5. The process of claim 1 wherein said angle is about 80°.
6. The process of claim 1 wherein the ratio of thickness of the metal adjacent to said step to that on said surface is at least about 2:1.
7. The process of claim 1 wherein the thickness of the metal adjacent the step is about equal to the height of the step.
8. The process of claim 1 wherein the maximum width of the mesa is about 5000 angstroms.
9. The process of claim 1 wherein the width of said mesa is at least about 100 angstroms.
10. The process of claim 1 wherein the width of said mesa is about 150 to about 1000 angstroms.
11. The process of claim 1 which further includes providing doped silicon at the sides of said mesa and on the top of said mesa.
12. The process of claim 1 wherein the source and drain are provided by depositing doped silicon.
13. The process of claim 1 wherein said mesa is removed and the silicon on the top thereof is lifted off.
14. The process of claim 11 wherein metallic type interconnections are provided to the source, drain, and gate regions.
15. The process of claim 13 which further includes oxidizing the exposed silicon surfaces to provide a gate oxide.
16. The process of claim 15 wherein the gate oxide is about 50 to about 100 angstroms thick.
17. The process of claim 16 which further includes providing metallic type high electrical conductivity interconnection to said source and drain regions.

* * * * *